US007092466B2

(12) United States Patent
Hwang et al.

(10) Patent No.: US 7,092,466 B2
(45) Date of Patent: Aug. 15, 2006

(54) SYSTEM AND METHOD FOR RECOVERING AND DESERIALIZING A HIGH DATA RATE BIT STREAM

(75) Inventors: Sakyun Hwang, Fullerton, CA (US); Seong-Ho Lee, Fullerton, CA (US); Christopher R. Pasqualino, Glendora, CA (US); Stephen G. Petilli, Pasadena, CA (US); Hao O. Phung, Alhambra, CA (US)

(73) Assignee: Broadcom Corporation, Irvine, CA (US)

( * ) Notice: Subject to any disclaimer, the term of this patent is extended or adjusted under 35 U.S.C. 154(b) by 845 days.

(21) Appl. No.: 10/144,326

(22) Filed: May 13, 2002

(65) Prior Publication Data

US 2003/0115542 A1    Jun. 19, 2003

Related U.S. Application Data

(60) Provisional application No. 60/341,669, filed on Dec. 17, 2001.

(51) Int. Cl.
*H04L 7/00*     (2006.01)
*H04L 25/00*    (2006.01)

(52) U.S. Cl. ...................... 375/355; 375/371
(58) Field of Classification Search ............... 375/355, 375/371, 373, 376, 354
See application file for complete search history.

(56) References Cited

U.S. PATENT DOCUMENTS 4,821,296 A    4/1989    Cordell

| 5,008,636 | A |   | 4/1991 | Markinson et al. |
|---|---|---|---|---|
| 5,278,873 | A |   | 1/1994 | Lowrey et al. |
| 5,648,994 | A |   | 7/1997 | Kao |
| 5,905,769 | A |   | 5/1999 | Lee et al. |
| 6,959,058 | B1 | * | 10/2005 | Yoo et al. ................... 375/355 |

OTHER PUBLICATIONS

Digital Display Working Group, Digital Visual Interface DVI Revision 1.0, Apr. 2, 1999.

* cited by examiner

*Primary Examiner*—Jay K. Patel
*Assistant Examiner*—David B. Lugo
(74) *Attorney, Agent, or Firm*—Garlick, Harrison & Markison; Bruce Garlick

(57)         ABSTRACT

A deserializer that deserializes a high data rate bit stream to extract a set of bits contained therein includes a data sampler, a serial-to-parallel converter, a windowing block, and a phase error detection block. The data sampler over samples the high data rate bit stream to produce a serial group of samples corresponding to the set of bits of the high data rate bit stream. The serial-to-parallel converter couples to the data sampler and converts the serial group of samples into a parallel group of samples. The windowing block receives the parallel group of samples and produces output bits corresponding to the set of bits. The phase error detection block couples to the windowing block, detects errors in the alignment of the overlapping sampling windows of the windowing block, and directs the windowing block to adjust the operation. The phase error detection block and the windowing block compensate for bit stream jitter and intersymbol interference.

41 Claims, 12 Drawing Sheets

| coef | Upper | Lower |
|---|---|---|
| 0 | 64 | -64 |
| 1 | 128 | -128 |
| 2 | 256 | -256 |
| 3 | 512 | -512 |
| 4 | 1024 | -1024 |
| 5 | 2048 | -2048 |
| deflt. | 512 | -512 |

1. X = UPPER, RESET ACCUMULATOR AND OUTPUT DECREMENT
2. X = LOWER, RESET ACCUMULATOR AND OUTPUT INCREMENT
3. NO ACTION (NEITHER INCREMENT NOR DECREMENT)

SYSTEM AND METHOD FOR RECOVERING AND DESERIALIZING A HIGH DATA RATE BIT STREAM

CROSS REFERENCE TO RELATED APPLICATION

This application claims priority to U.S. Provisional Application Ser. No. 60/341,669, filed Dec. 17, 2001, the disclosure of which is incorporated herein by reference.

FIELD OF THE INVENTION

This invention relates generally to digital communications; and more particularly to serial data communications.

BACKGROUND OF THE INVENTION

Communication technologies that link electronic devices are well known in the art. Some communication technologies link electronic devices via networks. Examples of such networks include wired computer networks, wireless computer networks, wired telephone networks, wireless telephone networks, and satellite communication networks, among other networks. Within such communication networks, a network infrastructure couples electronic devices to one another. Other communication technologies simply link one electronic device to another electronic device. Examples of these types of links include links between computers and their peripheral devices, links between portable data units and computers, links between video sources (such as cable and satellite set top boxes) and video monitors, and links between audio devices, among other examples. With regard to the computer and peripheral device example, communication links couple the computer to its display, the computer to its printer, the computer to its mouse, and the computer to its keyboard, among links.

Many communication link applications require high data rate throughput with minimal or no error in the data transmitted. Some of these communication links operate in a parallel fashion in which data is carried on a plurality of physical conductors and is clocked in unison with data on other of the conductors. Other of these communication links operate in a serial fashion in which data is carried on a single physical conductor from the first device to the second device in a serial fashion.

One particular type of serial link is a high-speed bit stream serial link. In a high-speed bit stream serial link, data is transmitted from a transmitting device to a receiving device one bit at a time so that, over time, a plurality of bits of data are transferred. An example of such a high-speed bit stream serial link is described generally in the digital visual interface (DVI) standard promulgated by the digital display working group. The DVI standard sets forth a high-speed bit stream serial link that carries display information from a transmitter to a receiver. The transmitter may be contained in a computer, a cable modem set top box, a satellite receiver set top box, or another source of video data while the receiver is typically contained in a monitor that displays visual information that is received on the high data rate bit stream serial link.

The DVI standard describes the operational characteristics of a physical communication path between a transmitter and a receiver that includes a bit clock and at least serial data interface having a plurality of bits stream paths. The bit clock and bits stream paths may operate at frequencies up to 1.6 Gigahertz. At such operating frequencies, bits traveling along the bit stream path(s) are subject to a number of operating conditions that distort the bits as they pass from the transmitter to the receiver. Distortion of bits caused by dispersion along the physical media is generally referred to as inter-symbol interference (ISI). ISI distorts the bits such that extraction of the bits from the bit stream is subject to error. Further, the data bit stream(s) is/are often times not aligned fully with the bit clock. Mis-alignment between a bit stream and its bit clock typically varies over time and is referred to as bit stream jitter. Bit stream jitter often prevents the successful extraction of bits from the bit stream. Whenever bits are not properly extracted by the receiver from the bit stream, visual data is lost. However, bit stream jitter is common. In many operations, bit stream jitter makes it extraordinarily difficult to successfully meet a data rate, e.g., an error rate of $10^{-9}$ or less Heretofore, prior devices have been unsuccessful in overcoming high bit stream jitter and significant ISI. Therefore, there is a need in the art for a system and associated method for accurately recovering and deserializing a high data rate bit stream even when the high data rate bit stream is subject to considerable jitter and ISI.

SUMMARY OF THE INVENTION

Thus, a deserializer constructed according to the present invention deserializes a high data rate bit stream to extract a set of bits contained therein. The deserializer of the present invention includes a data sampler, a serial-to-parallel converter, a windowing block, and a phase error detection block. The data sampler over samples the high data rate bit stream to produce a serial group of samples corresponding to the set of bits of the high data rate bit stream. The set of bits referred to herein refers to a group of bits of a particular size. For example, in the DVI specification, bits are considered in groups of ten. Thus, in one embodiment described herein, the set of bits of the high data rate bit stream includes 10 bits.

The data sampler over samples the high data rate bit stream at a rate that, in one embodiment, is 6 times the bit rate. Thus, for example when the bit rate is 1.6 gigahertz the data sampler samples the high data rate bit stream a 6 times the 1.6 gigahertz bit rate. In such case, the data sampler will sample the high data rate bit stream at 9.6 gigahertz.

The serial-to-parallel converter couples to the data sampler and converts the serial group of samples into a parallel group of samples. The parallel group of samples corresponds to the set of bits. Further, the parallel group of samples also corresponds to at least one bit that precedes the set of bits and at least one bit that is subsequent to the set of bits. Thus, for example, for a set of 10 bits the serial-to-parallel converter will include samples for each of these 10 bits plus at least one bit preceding the set of 10 bits and at least one bit subsequent to the set of 10 bits.

The serial-to-parallel converter as well as the data sampler operate based on a bit clock received in conjunction with the high data rate bit stream. The bit clock is received by a clock circuit, which generates the 6 times sampling clock for the data sampler. Thus, for the example wherein the set of bits includes 10 bits and one bit on each side of the 10 bits is also sampled, each bit is sampled 6 times, a total of 72 samples for the set of bits and the preceding and subsequent bits will be made. Further, the clock circuit produces parallel sample clock that operates at the frequency at which the serial-to-parallel converter produces data.

The windowing block couples to the serial-to-parallel converter and includes a plurality of overlapping sampling windows. Each of these overlapping sampling windows receives a plurality of samples that correspond to a respected target bit and to adjacent bits, such adjacent bits adjacent to the target bit. Each of the overlapping sampling windows produces a single bit output wherein each single bit output represents one of the sets of bits that the deserializer extracts. Thus, the windowing block produces a set of bits corresponding to the set of bits received on the serial link.

The phase error detection block couples to the windowing block and detects errors in the alignment of the overlapping sampling windows of the windowing block. The error in the alignment of the overlapping sampling windows represents the skew or jitter in the high data rate bit stream as compared to the bit clock received in conjunction therewith. The phase error detection block therefore directs the windowing block to adjust the operation of the plurality of overlapping sampling windows to produce the single bit outputs. Thus, in conjunction, the windowing block and the phase error detection block compensate for the jitter of the high data rate bit stream with respect to the bit clock and for inter-symbol interference.

The various components of the windowing block and phase error detection block are implemented in more than a single block or set of operations. For example, the windowing block includes the plurality of overlapping windows and a bit selection block. Further, the phase error detection block includes a plurality of phase error windows, an error accumulator, and an error index generation that produces a window index control. The window index control is used to adjust the alignment of the plurality of sampling windows of the windowing block.

The structure and operation of the deserializer of the present invention compensates not only for jitter in the high data rate bit stream but also the distortion of the bit stream produced by inter-symbol interference. Thus, the deserializer of the present invention meets the requirements for pixel error rates even with significant timing jitters of the high data rate bit stream.

Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE INVENTION

Figure 1A:
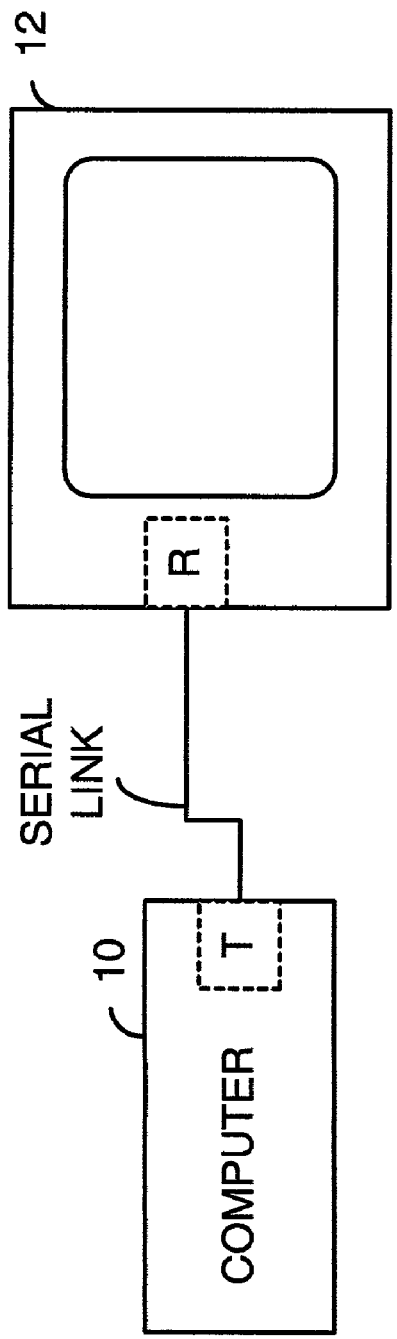
FIG. 1A is a block diagram illustrating a computer and a monitor that intercouple according to the present invention.

FIG. 1A is a block diagram illustrating a computer 10 and a monitor 12 that communicate via a serial link that operates according to the present invention. In this embodiment, the computer 10 produces visual information in the form of a high data rate bit stream that it transmits to the monitor 12 via the serial link. As is shown diagrammatically in FIG. 1A, the computer 10 includes a transmitter T while the monitored 12 includes a receiver R. In one embodiment of the serial link, the DVI operating standards are substantially met, except as they may have been modified according to the present invention. In such case, the serial link includes a physical media that carries at least one high data rate bit stream and at least one bit clock. The description of the serial link provided herein will often times refer to only a single high data rate bit stream and a single bit clock. However, other embodiments of the present invention will include a plurality of high data rate bit streams and one or more bit clocks. In such embodiments, additional physical media lines carry the additional high data rate bit streams and bit clocks.

Figure 1B:
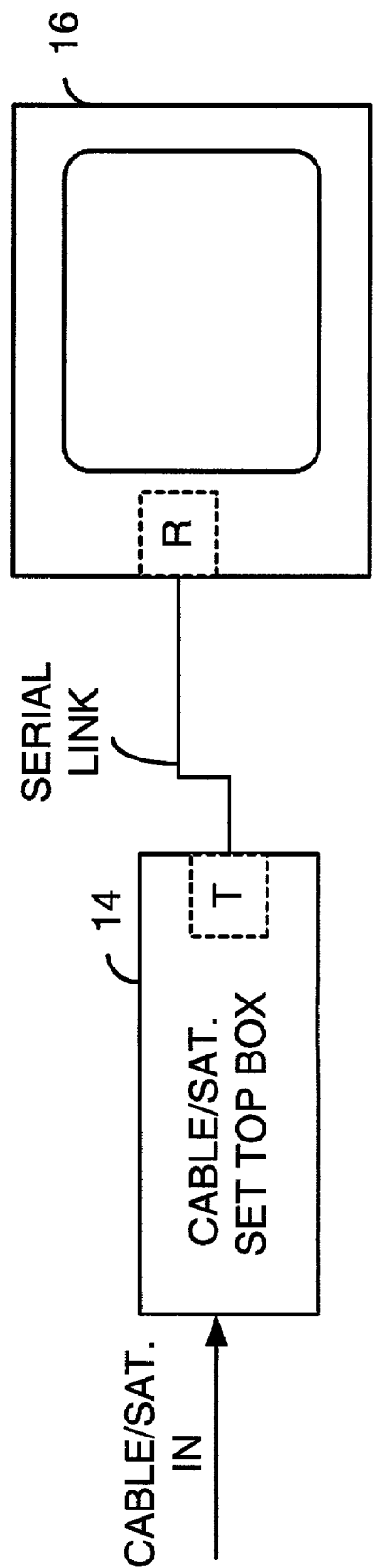
FIG. 1B is a system diagram illustrating a cable/satellite set top box and a video display that intercouple according to the present invention.

FIG. 1B is a system diagram illustrating a cable/satellite set top box and a video display that intercouple according to the present invention. As shown in FIG. 1B, a serial link couples a cable/satellite set top box 14 to a video display 16. The cable/satellite set top box receives input via a cable/satellite input line, processes the cable/satellite input to produce video information, and transmits the video information to the monitor 16 via a serial link that operates according to the present invention. As was the case with the description of FIG. 1A, the serial link of FIG. 1B includes at least one high data rate bit stream link and at least one bit clock, both of which are provided by the transmitter of the cable/satellite set top box 14 to the video display 16.

Figure 1C:
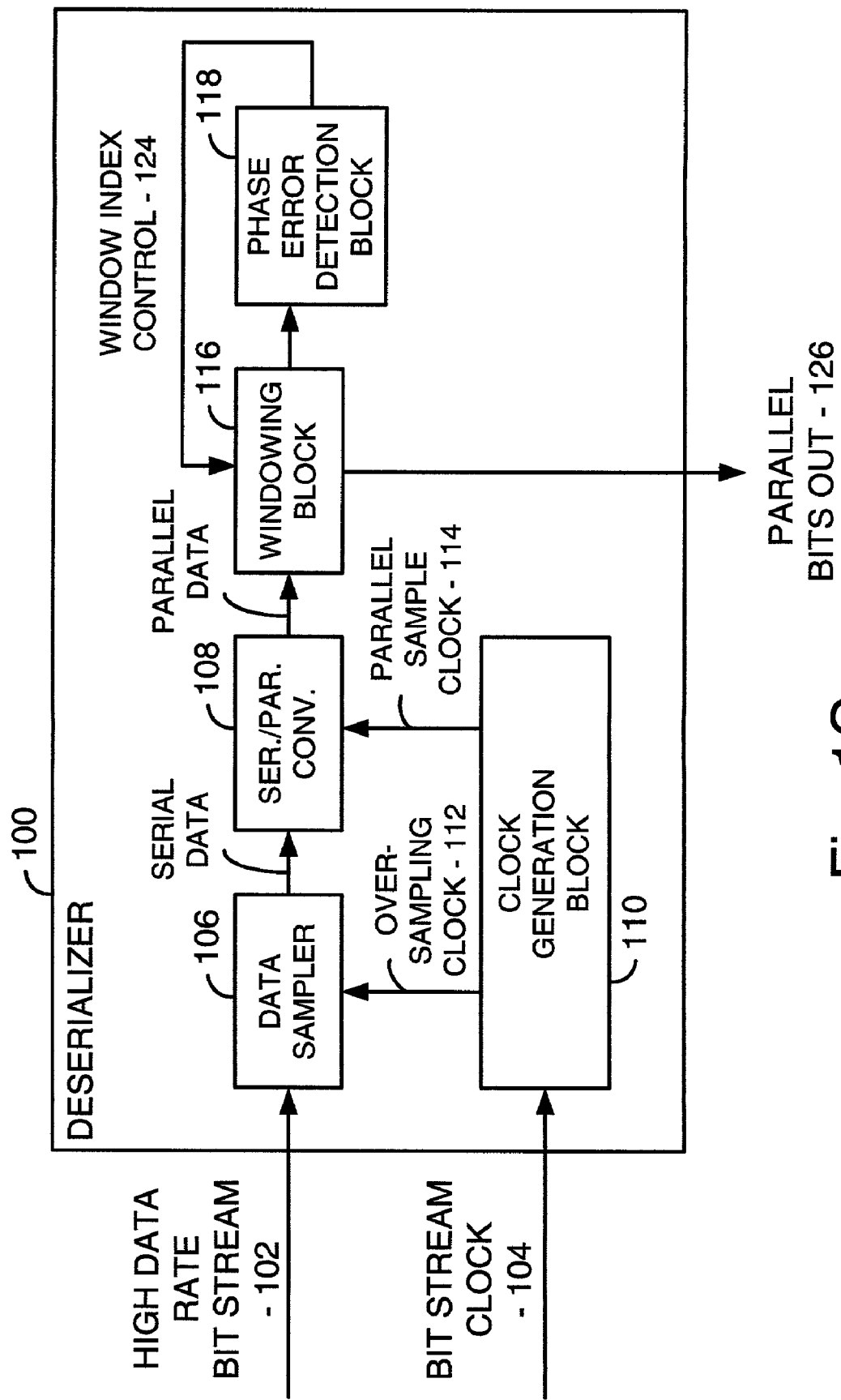
FIG. 1C is a block diagram illustrating a first embodiment of a deserializer constructed according to the present invention.

FIG. 1C is a block diagram illustrating a first embodiment of a deserializer constructed according to the present invention. A deserializer 100 shown in FIG. 1C receives a high data rate bit stream 102 and a bit stream clock 104. The deserializer 100 produces parallel bits out 126 that represent the bits contained in the high data rate bit stream 102. The principles of the present invention allow the deserializer 100 to accurately extract the bits from the high data rate bit stream 102 even though significant inter-symbol interference (ISI) and jitter in the high data An rate bit stream 102 exist. As is generally known, jitter between two serial paths is a term used to describe the relative offset between the bits contained in the two serial paths. In a perfect operating environment, the bit stream clock 104 will have a clock contained thereon that has edges that precisely correspond to bits of information contained in the high data rate bit stream 102, such precise correspondence non-time varying. This precise correspondence may include the transitions of the bit stream clock 104 aligning perfectly with the transitions of the high data rate bit stream 102 or may include precise offset in alignment.

During normal operating conditions, however, the rising edges of the bit stream clock 104 differ in alignment over time with the transition edges of the bits contained in the high data rate bit stream 102. The variation in offset over time is referred to as jitter in the serial path. The deserializer 100 of FIG. 1C produces parallel bits out 126 having a pixel error rate of less than $10^{-9}$ even with a jitter of up to 0.30 times the period of the bit stream clock 104. In some embodiments, this bit error rate may be achieved even with greater jitter, e.g., 0.50 times the period of the bit stream clock 104.

The deserializer 100 includes a data sampler 106, a serial-to-parallel converter 108, a windowing block 116, and a phase error detection block 118. The deserializer 100 also includes a clock generation block 110. The clock generation block 110 produces an oversampling clock 112 and a parallel sample clock 114. The oversampling clock 112 has a frequency that is a multiple of the frequency of the bit stream clock 104. In one embodiment described herein, the oversampling clock 112 has a frequency that is 6 times the frequency of the bit stream clock 104. With the data sampler 106 provided this oversampling clock 112, it samples the high data rate bit stream 102 at a frequency that is 6 times the bit rate of the high data rate bit stream 102. Thus, the sampling period of the data sampler 106 based upon the oversampling clock 112 is $\frac{1}{6}^{th}$ the period of the high data rate bit stream 102 and for each bit contained in the bit stream, the data sampler 106 will produce as serial data 6 samples. In the embodiment of FIG. 1C, the data sampler 106 produces either a binary 1 or a binary 0 for each sample interval.

The serial-to-parallel converter 108 receives the serial data from the data sampler 106 and the parallel sample clock 114. At each parallel sample clock 114 interval, the serial-to-parallel converter 108 produces a parallel group of samples (parallel data). The parallel group of samples includes a plurality of bits corresponding to each of the set of bits. The set of bits includes a particular number of bits, e.g., 10 bits in a DVI application. The parallel group of samples also includes samples corresponding to at least 1 bit preceding the set of bits and at least 1 bit subsequent to the set of bits. Thus, for an embodiment of the deserializer servicing a DVI receiver, wherein the set of bits includes 10 bits, the parallel data will include 6 samples for each of the 10 bits and will also include 6 samples for the preceding bit and 6 samples for the subsequent bit. Thus, the parallel data will include 72 bits of data.

The windowing block 116 receives the parallel data from the serial-to-parallel converter 108. As its output, the windowing block 116 produces parallel bits out 126 that correspond to the set of bits of the high data rate bit stream 102. The windowing block 116 includes a plurality of overlapping sampling windows. Each of these overlapping sampling windows receives a plurality of samples of the parallel data. Further, each of these overlapping sampling windows will correspond to a respective target bit of the set of bits and adjacent bits of the target bit.

The phase error detection block 118 receives input from the windowing block 116 and detects an error in the alignment of the plurality of overlapping sampling windows of the windowing block 116. Based upon the input it receives from the windowing block 116, the phase error detection block 118 produces a window index control 124 and provides the window index control 124 to the windowing block 116. The windowing block 116 receives the window index control 124 and adjusts the alignment of the plurality of overlapping sampling windows in an attempt to accurately align each sampling window with the plurality of samples corresponding to a target bit. Such adjustment in alignment addresses jitter and ISI.

Figure 2:
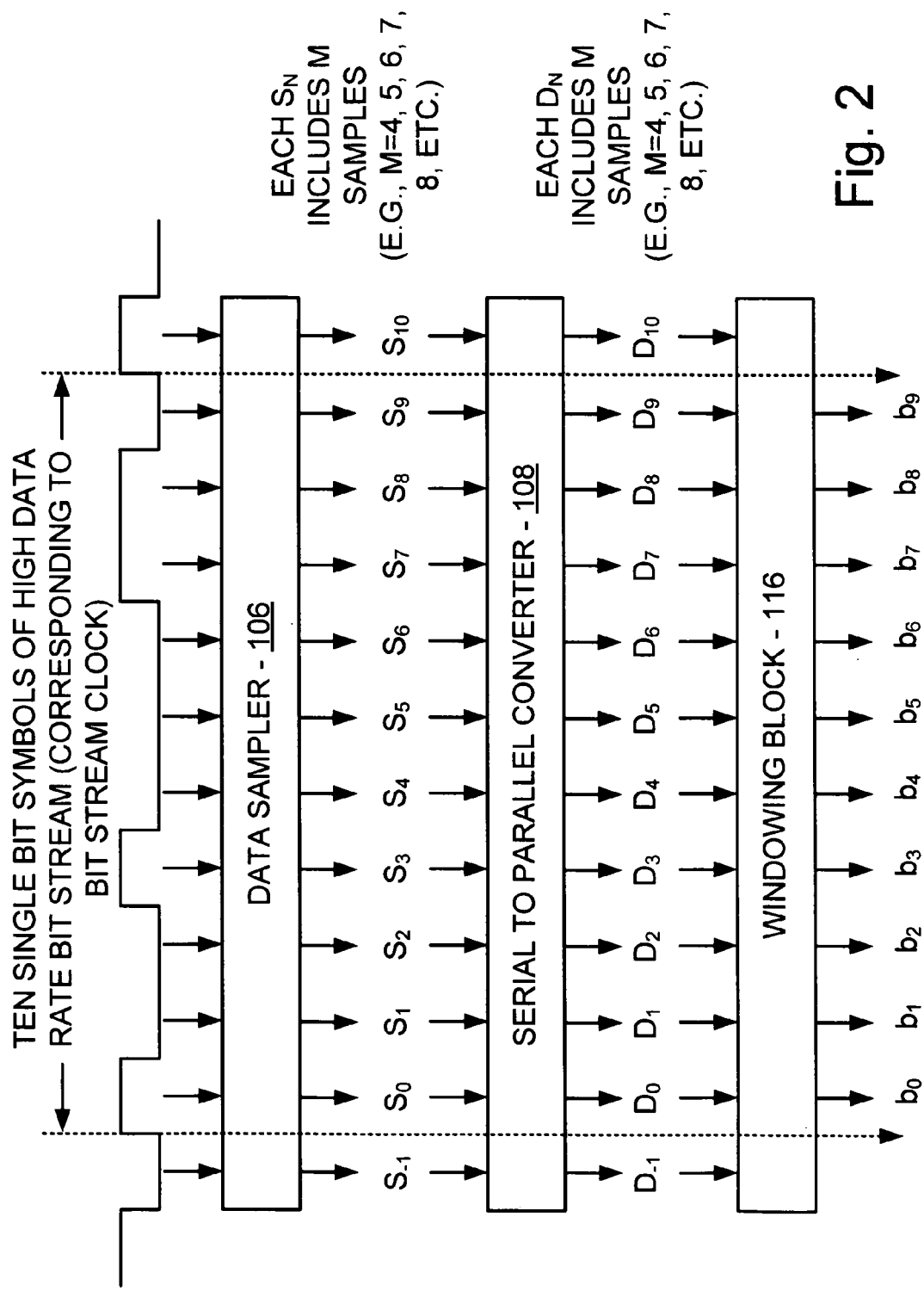
FIG. 2 is a diagram illustrating the manner in which a high data rate bit stream is operated upon according to the present invention to produce output.

FIG. 2 is a diagram illustrating the manner in which a high data rate bit stream is operated upon according to the present invention to produce output. The example of FIG. 2 considers the situation in which 10 single bit symbols of the high data rate bit stream are extracted during each period of operation. In such case, the data sampler 106 samples the 10 single bits of the symbol and adjacent bits. The data sampler 106 produces as its outputs sample groups $S_0$ through $S_9$ for the targeted 10 single bit symbol and also samples groups $S_{-1}$ and $S_{10}$ that correspond to adjacent bits bordering the 10 single bit symbol. Each sample group $S_n$ includes a plurality of samples. In the example described previously, each sample group $S_n$ includes 6 particular samples, each of which comprises either a binary 1 or a binary 0. However, in other embodiments the number of samples taken for each bit in the bit stream may be greater than or less than 6 samples. The serial-to-parallel converter 108 receives each of the sample groups $S_{-1}$ through $S_{10}$ and produces the parallel data groups ($D_{-1}$ through $D_{10}$) as its output. As was the case with the serial samples $S_1$ through $S_{10}$, each of the parallel data groups $D_{-1}$ through $D_{10}$ includes the same number of individual values, e.g. 6. The windowing block 116 receives the parallel data groups $D_{-1}$ through $D_{10}$ and produces as its output the output bits $b_0$ through $b_9$ which represent the bits contained in the set of bits of the high data rate bit stream.

Figure 3:
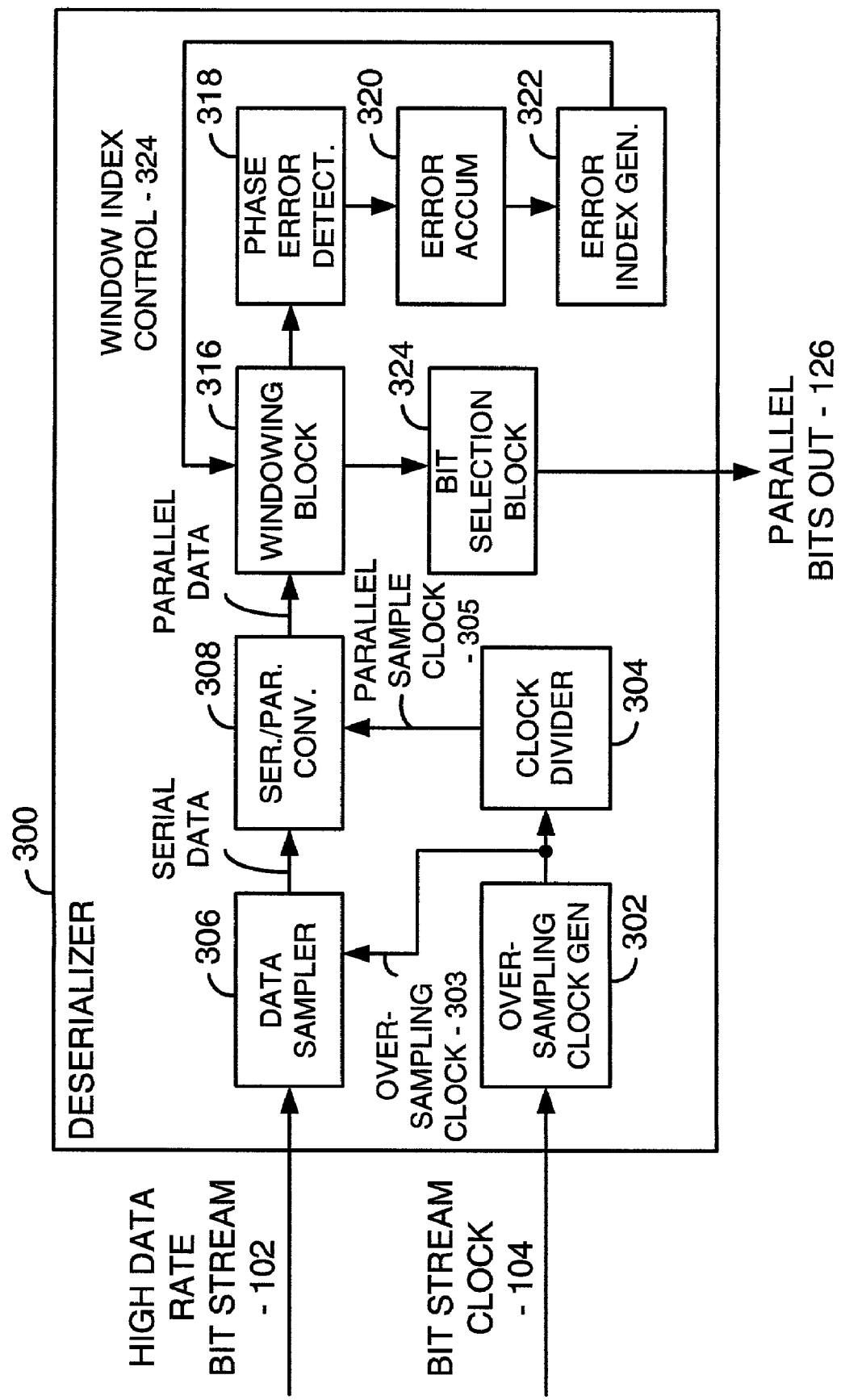
FIG. 3 is a block diagram illustrating a second embodiment of a deserializer constructed according to the present invention.

FIG. 3 is a block diagram illustrating a second embodiment of a deserializer constructed according to the present invention. As is shown in FIG. 3, the deserializer 300 receives the high data rate bit stream 102 and a bit stream clock 104 and produces parallel bits out 126. The deserializer 300 includes a data sampler 306 that receives an oversampling clock 303 from the oversampling clock generator 302 and the high data rate bit stream 102. The oversampling clock generator 302 receives as its input the bit stream clock 104 and produces the oversampling clock 303 that has a frequency that is a multiple of the frequency of the bit stream clock 104. This multiple may be 4, 5, 6, 7, 8, 9 or greater. The data sampler 306 samples the high data rate bit stream 102 at the oversampling clock 303 frequency which is a multiple of the bit rate of the high data rate bit stream 102.

The data sampler 306 produces serial data as its output, which is received by the serial-to-parallel converter 308. The serial-to-parallel converter 308 also receives a parallel sample clock 305 from clock divider 304. The clock divider 304 receives as its input the oversampling clock 303 from the oversampling clock generator 302. The clock divider divides down the oversampling clock 303 to produce the parallel sample clock 305. Generally speaking, the parallel sample clock 305 is at a frequency corresponding to a group of bits of the high data rate bit stream 102. As was shown in FIG. 2, the parallel sample clock 305 will produce parallel data output at a rate corresponding to the number of bits in the set of bits. In the example previously described, the set of bits includes 10 bits and the parallel sample clock 305 is $\frac{1}{10}^{th}$ the frequency of the bit stream clock 104.

The windowing block 316 receives the parallel data and couples to both the bit selection block 324 and a phase error detection block 318. The bit selection block 324 produces parallel bits out 126 that correspond to the bits contained in the high data rate bit stream 102. The operation of the bits selection block will be described further with reference to FIG. 6.

The phase error detection block 318 receives its input from the windowing block 316 and determines an error in the alignment of the plurality of overlapping sampling windows of the windowing block 316. The phase error detection block 318 produces an error output to an error accumulator 320. The error accumulator 320 produces an output to the error index generation block 322, which produces the window index control 324. The window index control signal 324 is provided to the windowing block 318 for adjustment of the alignment of the plurality of overlapping sampling windows.

Figure 4:
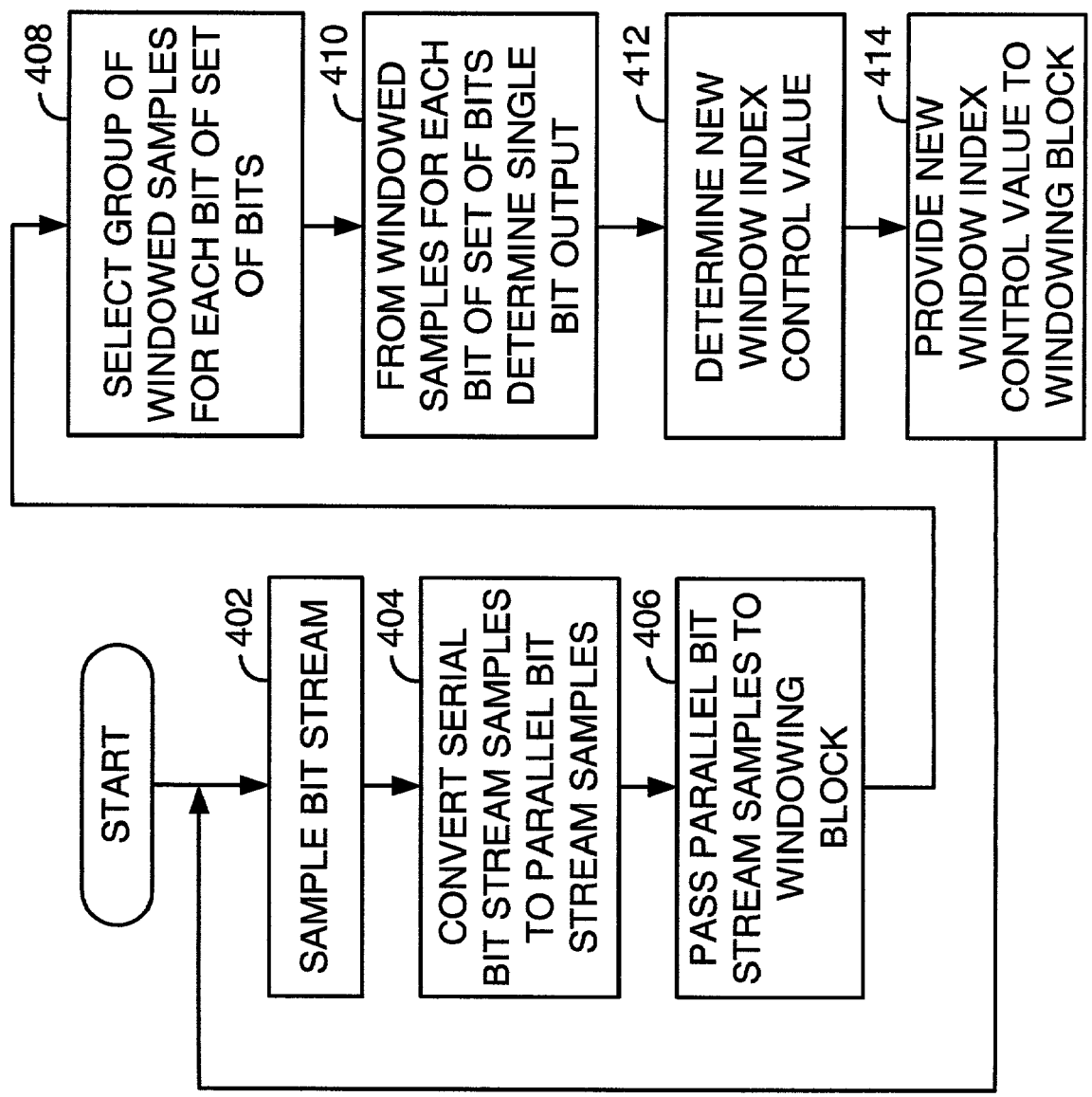
FIG. 4 is a logic diagram illustrating an operation according to the present invention.

FIG. 4 is a logic diagram illustrating an operation according to the present invention. As shown in FIG. 4, operation commences wherein the deserializer samples the high data rate bit stream (step 402). The deserializer then converts the serial bit stream samples to parallel bit stream samples (step 404). The parallel bit stream samples correspond not only to a set of bits to be extracted from the high data rate bit stream but also to adjacent bits of the high data rate bit stream. In one embodiment, the parallel bit stream samples (parallel data) includes a group of samples corresponding to one bit preceding the set of bits and also a group of samples corresponding to one bit subsequent to the set of bits.

The parallel bit stream samples are then passed to the windowing block (step 406). The windowing block selects a group of windowed samples for each bit of the set of bits (step 408). Then, each windowed group of samples are passed to the bit selection block selects that produces a single bit that represents a corresponding bit of the set of bits (step 410). Thus, the bit selection block has produced a set of bits that have been extracted from the high data rate bit stream.

Then, a new window index control value is determined (step 412). This new window index control value is then provided to windowing block for adjustment of the plurality of overlapping sampling windows of the windowing block (step 414). From step 414, operation proceeds again to step 402 wherein extraction of the set of bits subsequent to the previously extracted set of bits is performed.

Figure 5:
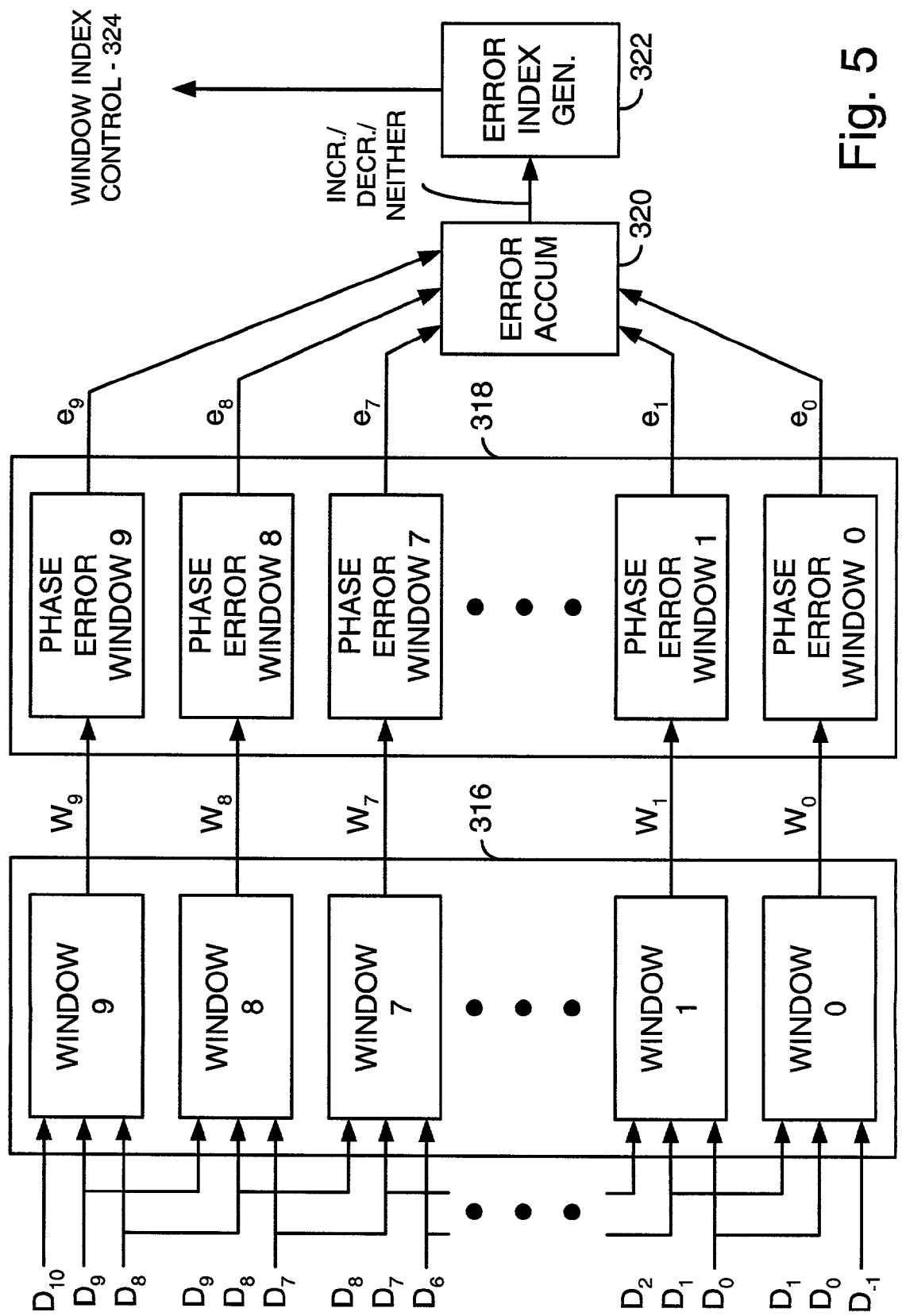
FIG. 5 is a block diagram illustrating the windowing block and phase error detection block that are constructed and operate according to the present invention.

FIG. 5 is a block diagram illustrating the windowing block and phase error detection block that are constructed and operate according to the present invention. As shown in FIG. 5, the windowing block 316 includes a plurality of overlapping sampling windows, window 0, window 1, ..., window 7, window 8, and window 9. Each of these overlapping sampling windows receives 3 parallel groups of samples. For example, window 0 receives parallel data sample groups $D_{-1}$, $D_0$ and $D_1$. $D_0$ is a group of samples that corresponds to a least significant bit of the set of bits being deserialized during the particular operation. The sample group $D_{-1}$ corresponds to a bit preceding the least significant bit in the set of bits wherein the set of bits includes 10 bits. Sample group $D_0$ corresponds to the least significant bit of the set of bits in sample group and $D_1$ corresponds to the next to least significant bit of the set of 10 bits. Window 7 receives 3 groups of samples of the parallel data. A first group of samples corresponds to the previous bit in the set of bit streams, samples $D_6$. The second group of samples corresponds to the target bit of the set of bits, $D_7$. The third group of samples of the parallel data corresponds to the bit subsequent to the target bit, that group of samples being $D_8$.

Thus, each of the plurality of overlapping sampling windows receives groups of samples corresponding to its respective target bit and also groups of samples corresponding to adjacent bits. In the embodiment where each of the group of samples includes 6 individual samples, each of the plurality of overlapping sampling windows will receive 18 bits of the parallel data. Each of the overlapping sampling windows produces a plurality of bits, such plurality of bits comprising a set of the input bits received by the overlapping sampling window. In one embodiment, each overlapping sampling window produces 6 bits of output to the phase error detection block 318. In another embodiment, each overlapping sampling window produces 8 bits of output to the phase error detection block 318.

The phase error detection block 318 includes a plurality of phase error windows, phase error window 0, phase error window 1, ..., phase error window 7, phase error window 8, and phase error window 9. Each of these phase error windows corresponds to a respective bit of the set of bits, which the deserializer is extracting from the high data rate bit stream. Each of these phase error windows, phase error window 0 through phase error window 9 produces an error value. In the described embodiment, the phase error values $e_0$ through $e_9$ are integer values in the range of −3 to +3. The manner in which these error values are determined is described further with reference to FIGS. 7 and 8.

The error values produced by the phase error detection block 318 are received by the error accumulator 320. The error accumulator accumulates the errors produced not only during the particular sampling interval but also from prior sampling intervals. The error accumulator 320 produces as its output an indication to the error index generation block 322. This indication will be whether or increment, to decrement, or neither to increment nor to decrement the error index. The error accumulator 320 will be described with more detail with particular reference to FIGS. 9A, 9B, and 9C.

The error index generation block 322 receives its input from the error accumulator 320 and produces the window index control. Operation of the error index generation block 322 is described further with reference to FIGS. 10A and 10B. The window index control 324 is received by the windowing block 316 and used to adjust the alignment of the plurality of overlapping sampling windows of the windowing block 316.

Figure 6:
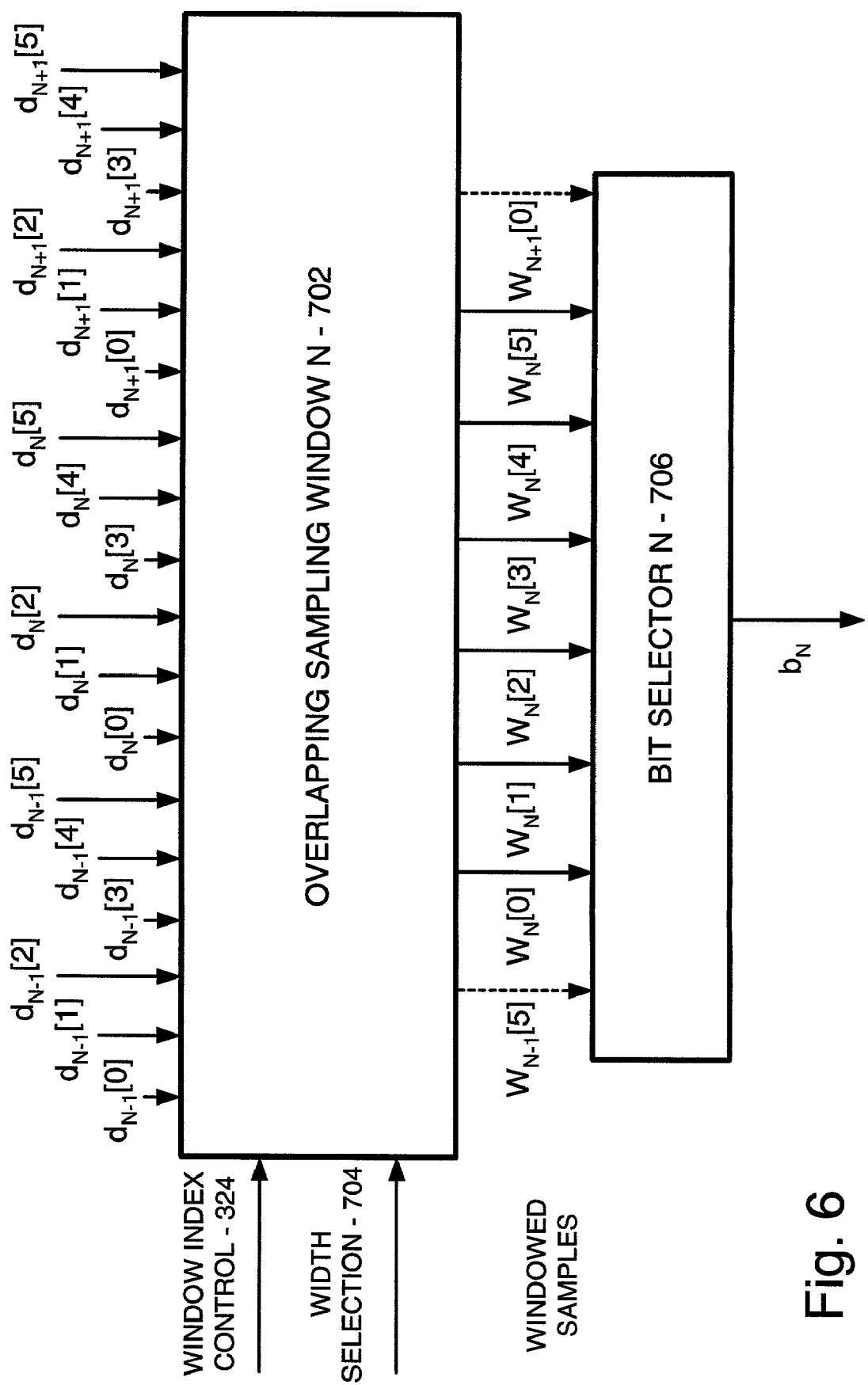
FIG. 6 is a block diagram illustrating an overlapping sampling window and a bit selection block constructed according to the present invention.

FIG. 6 is a block diagram illustrating an overlapping sampling window 702 and a bit selection block 706 constructed according to the present invention. As is shown in FIG. 6, overlapping sampling window 316 receives as its input a window index control 324 and, in one embodiment, a width selection input 704. The width selection input 704 determines a number of bits that each of the plurality of overlapping sampling windows will produce as its output.

The overlapping sampling window 316 also receives a plurality of groups of samples. A first group of samples corresponds to a target bit of the set of bits, the plurality of samples corresponding to the target bit are referenced as $d_N[0:5]$. The windowing block 316 also receives a plurality of bits corresponding to a bit preceding the target bit and also a plurality of samples corresponding to a bit that is subsequent to the target bit. A plurality of samples corresponding to the bit preceding the target bit are denoted as $d_{N-1}[0:5]$. The plurality of the samples corresponding to the bit subsequent to the target bit are referenced as $d_{N+1}[0:5]$. Thus, in the embodiment of FIG. 6 wherein each group of samples includes 6 values, the overlapping sampling window 702 receives 18 individual samples.

The overlapping sampling window 702 produces output samples that are received by a bit selector 706. For the embodiment described, the bit selection block 324 includes 10 bit selectors 706 when the set of bits includes 10 bits. When the width selection input 704 directs the overlapping sampling window 702 to produce 6 output bits, the overlapping sampling window 702 produces $W_N[0]$ to $W_N[5]$. However, the width selection input 704 directs the overlapping sampling window 700 to produce 8 output bits, the overlapping sampling window 702 produces and additional 2 bits, $W_{N-1}[5]$ and $W_{N+1}[0]$.

The window index control 324 determines which of the input bits of the groups of samples $d_{N-1}[0:5]$, $d_N[0:5]$, and $d_{N+1}[0:5]$ the overlapping sampling window 702 produces as the window bit outputs $W_N[0]$ through $W_N[5]$ (or $W_{N-1}[5]$ through $W_{N+1}[0]$ when 8 output bits are selected. For example, when the window index control 324 is at its greatest the overlapping sampling window 702 selects the highest 6 bits that it has received as input, $d_{N+1}[0]$ through $d_{N+1}[5]$ as its output $W_N[0]$ to $W_N[5]$. Alternately, when the window index control 324 is at its lowest, the overlapping sampling window 702 selects the lowest set of samples that it receives, $d_{N-1}[0]$ through $d_{N-1}[5]$ as its output $W_N[0]$ to $W_N[5]$. These examples are provided when the overlapping sampling window 702 produces 6 bits as its output. When the overlapping sampling window 702 produces 8 bits as its output the lowest bits it could put out would be $d_{N-1}[0]$ through $d_N[2]$ and the highest bits it could output would be $d_N[4]$ through $d_{N+1}[5]$.

The bit selector 706 receives the windowed samples from the overlapping sampling window 702. The bit selector 706 produces as its output the target bit. In one embodiment of the present invention, the bit selector 706 selects the middle bit $W_N[3]$ as its output bit. In other embodiments, the bit selector 706 averages its inputs and determines a most likely output bit or uses a different technique to produce the output bit $b_N$.

Figure 7:
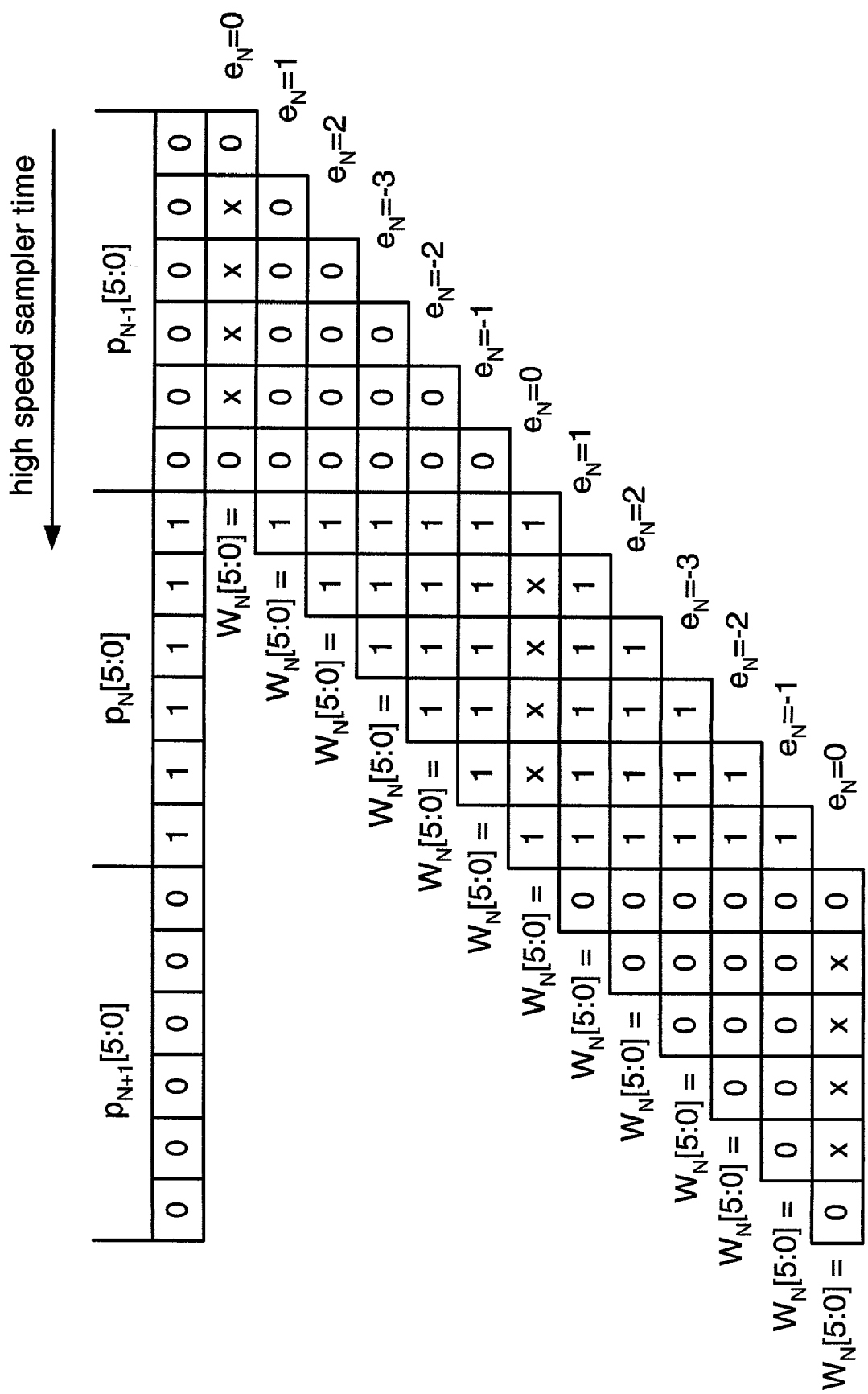
FIG. 7 is a diagram illustrating the manner in which phase error values are produced according to the present invention when six samples are used.

FIG. 7 is a diagram illustrating the manner in which phase error values are produced according to the present invention when six samples are used. Each of the phase error windows (as shown in FIG. 5) of the phase error detection block 318 produces a phase error value $e_0$ through $e_9$. For each particular phase error window, the output of a corresponding overlapping sampling window, e.g., 702, are compared to a plurality of sample patterns. In the example of FIG. 7, 6 bits and are shown as $W_N[5:0]$ are compared to the plurality of sample patterns, denoted $p_{N-1}[0:5]$, $p_N[0:5]$, and $p_{N+1}[0:5]$. When the overlapping sampling window is perfectly aligned with a particular target bit of the high data rate bit stream, the phase error window will produce an error output of 0. Thus, for the examples in which the error output is 0, the window $W_N[5:0]$ is such that its components align with either a bit that is 1 or a bit that is 0.

However, when the windowed value $W_N[5:0]$ does not contain either 1's at each end or both 0's at each end but includes a 1 at a first end and a 0 at another end, then an error value will be produced. The error values shown in FIG. 7 indicate the presumed relative alignments of the window with the actual target bit of the high data rate bit stream.

Figure 8:
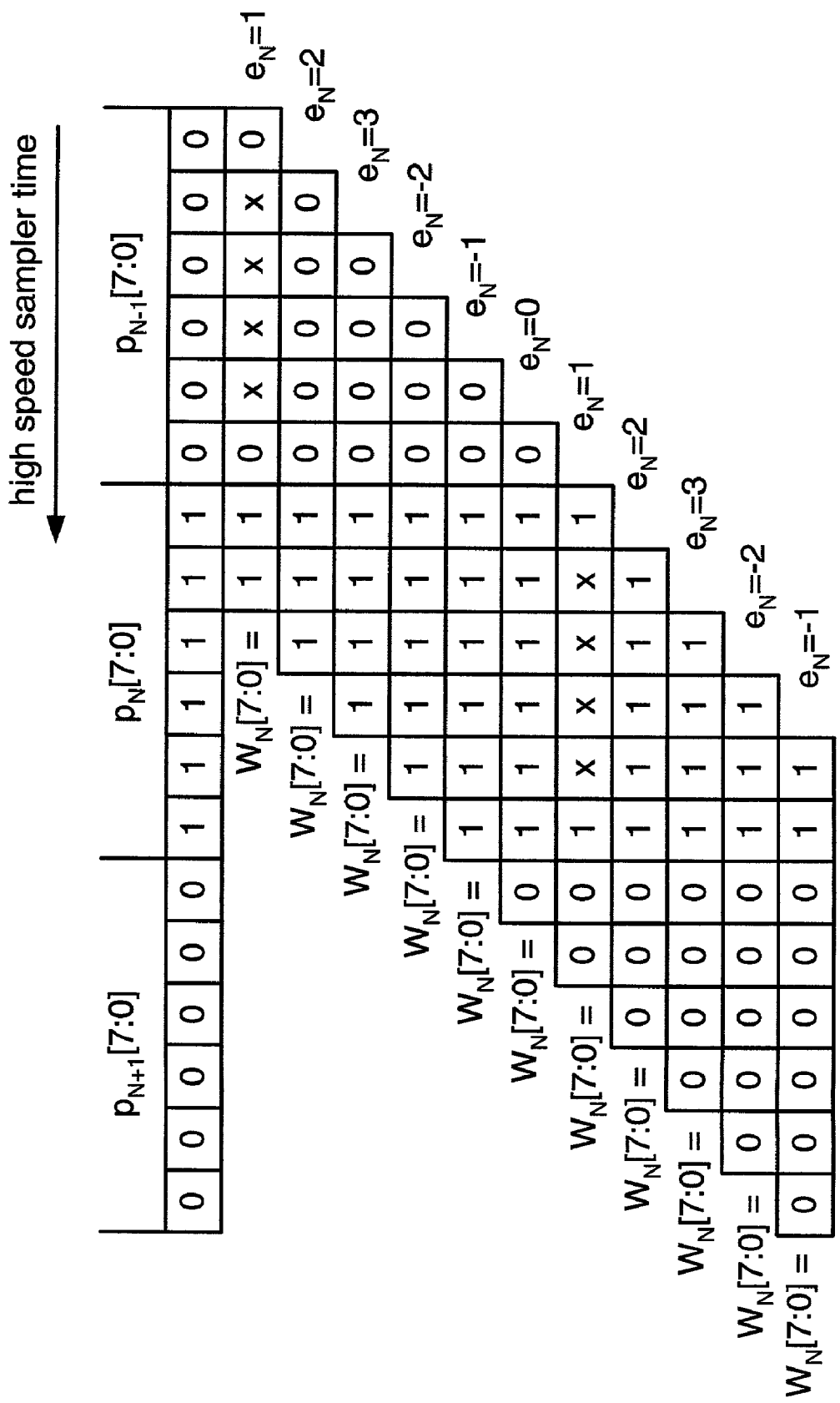
FIG. 8 is a diagram illustrating the manner in which phase error values are produced according to the present invention when eight samples are used.

FIG. 8 is a diagram illustrating the manner in which phase error values are produced according to the present invention when eight samples are used. As is shown in FIG. 8, the principles of FIG. 7 are extended for the situation in which the width selection of the overlapping sampling window N is 8 bits instead of 7 bits. In such case, fewer combinations of input in the windowed samples may be compared to the presumed correctness of the target bit $d_N$ and adjacent bits $d_{N+1}$ and $d_{N-1}$. As is shown, error values produced by the phase error detection block 318 range from 3 to −2.

Figures 9A, 9B, 9C:
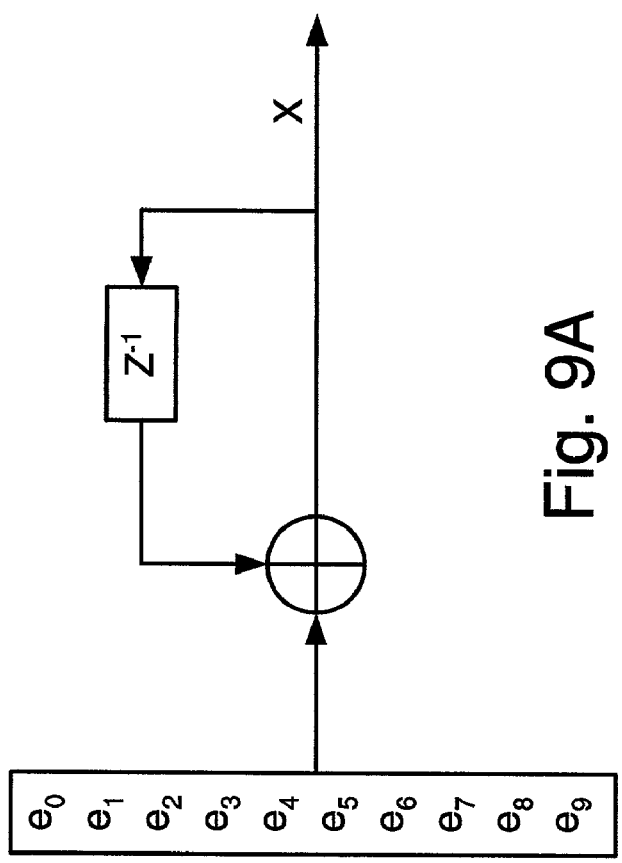
FIGS. 9A, 9B, and 9C are diagrams illustrating the manner in which an error accumulator block operates according to the present invention.

FIGS. 9A, 9B, and 9C are diagrams illustrating the manner in which an error accumulator block operates according to the present invention. The error accumulator block 320 as shown in both FIGS. 3 and 5 is implemented according to the description of FIGS. 9A, 9B, and 9C. For each parallel data sample interval corresponding to a particular set of bits, the error values $e_0$ through $e_9$ are summed together and also summed with the contents of the error accumulator 320 from a prior sample interval. As shown in FIG. 9B, the error accumulator may have differing upper and lower bounds depending upon the particular embodiment. The upper and lower bounds range from +64 and −64 up to +2048 and −2048. A default boundary set is +512 and −512.

As shown in FIG. 9C, for each sample interval, the error value $e_0$ through $e_9$ are first summed and then added to the prior contents of the error accumulator. When the sum of this operation reaches the upper boundary of the error accumulator, the accumulator contents are reset to 0 and a decrement direction is output from the error accumulator 320 to the error index generator 322. When the result of the operation of summing $e_0$ through $e_9$ with the prior value of the error accumulator reaches the lower boundary, then the accumulator is reset to 0 and an increment direction is sent from the error accumulator 320 to the error index generator 322. Finally, if after summing the error values $e_0$ through $e_9$ with the prior value of the accumulator does not result in either the upper or lower boundary of the error accumulator being reached, then no action is taken in neither an increment or a decrement direction as sent from the error accumulator to the error index generator block.

Figures 10A, 10B:
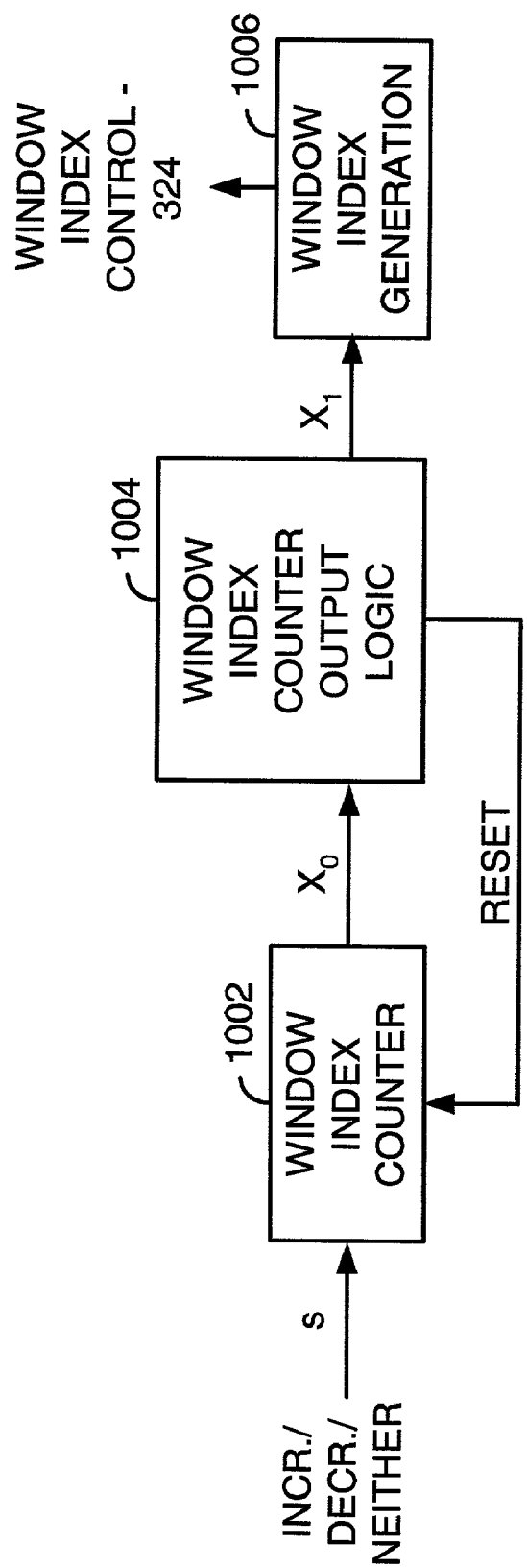
FIGS. 10A and 10B are diagrams illustrating the manner in which an error index generation block operates according to the present invention.

FIGS. 10A and 10B are diagrams illustrating the manner in which an error index generation block operates according to the present invention. As shown in FIG. 10A, the error index generator 322 includes a window index counter 1002 and window index counter output logic 1004. The window index counter 1002 receives as its input the output of the error accumulator 320, such input being labeled as s. The window index counter 1002 produces an output $X_0$ that is the sum of the prior contents of the window index counter 1002 and s. The output $X_0$ is received by the window index counter output logic 1004. The window index counter output logic produces output $X_1$.

Referring now to FIG. 10B, operation of both the window index counter 1002 and window index counter output logic 1004 as well as the manner in which the window index control 324 are described. The window index counter 1002 increments, decrements or does not change its value dependent upon its input s. The window index counter 1002 produces its value as the output $X_0$. Window index counter output logic 1004 receives the value of the window index counter $X_0$. If the value of the window index counter $X_0$ is equal to 26 or equal to 1, the window index counter output logic 1004 resets the value of the window index counter to 14. After this operation is complete, the window index counter output logic 1004 produces as its output the value of the window index counter $X_1$. The window index control generation block 1006 produces the window index control. The window index control 324 is equal to $(X_{1+1})\div 2$. This window index control value 324 is provided to the windowing block 316.

Figure 11A:
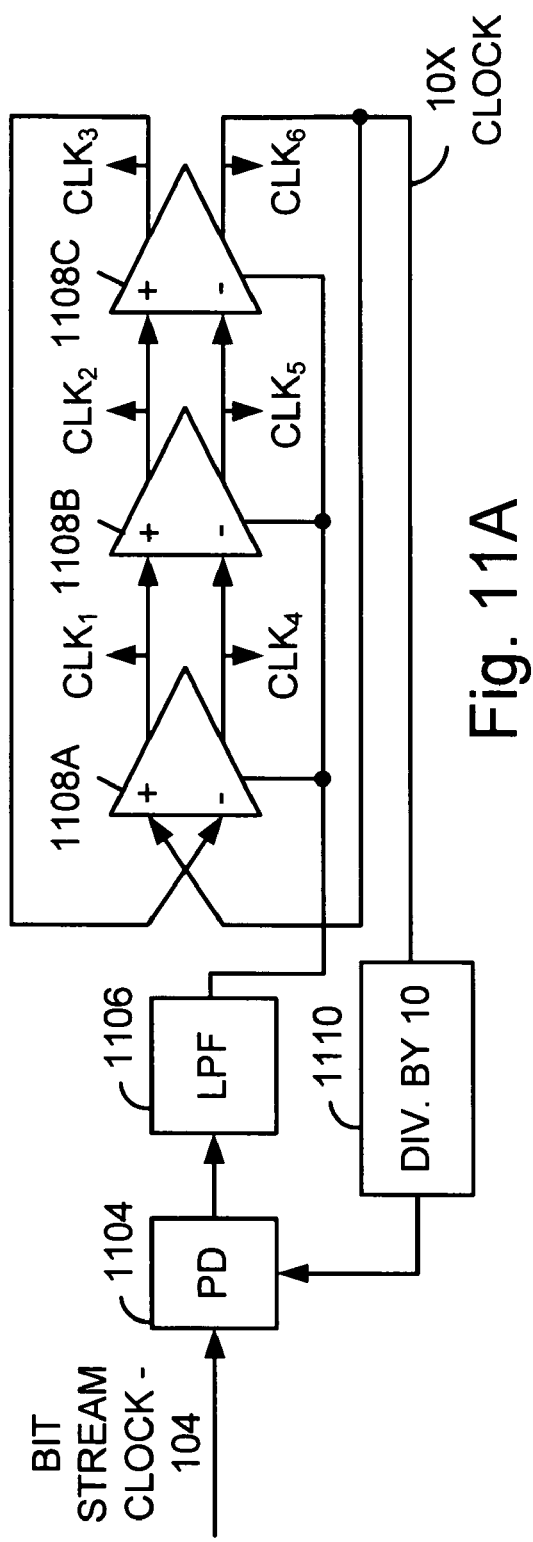
FIGS. 11A and 11B are diagrams illustrating the manner in which oversampling clocks are generated according to the present invention.
Figure 11B:
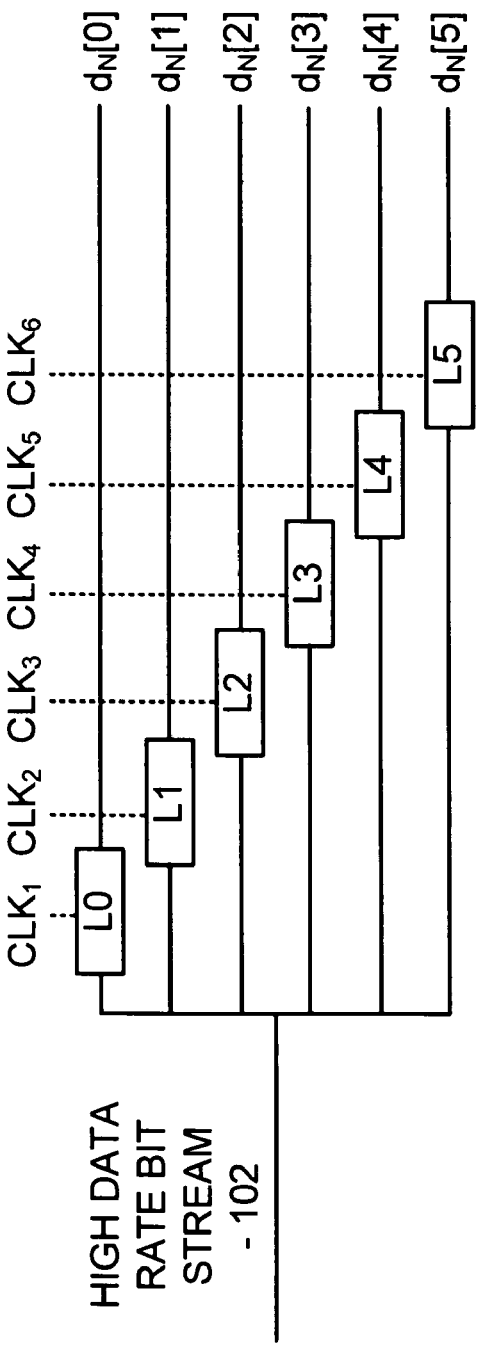

FIGS. 11A and 11B are diagrams illustrating the manner in which oversampling clocks are generated according to the present invention. As shown in FIG. 11A, the oversampling clock generator 302 receives as its input the bit stream clock 104 and generally speaking is a phase locked loop that produces 6 equidistance phases of the oversampling clock 303, $CLK_1$, $CLK_2$, $CLK_3$, $CLK_4$, $CLK_5$, and $CLK_6$. The bit stream clock 104 is received by phase detector 1104. The phase detector also receives the output divide by 10 counter 1110. The input of the divide by 10 counter 1110 is the 10X clock generated by the PLL of FIG. 11A. The output of the phase detector is provided to a low pass filter 1106. The 3 operational amplifiers 1108A, 1108B, and 1108C, are intercoupled to produce the 6 oversampling clock phases 303.

The structure of FIG. 11B illustrates one component of a serial-to-parallel converter 308. For the embodiment in which the serial-to-parallel converter 308 operates upon 10 bits of the high data rate bit stream at one time, the circuit of FIG. 11B would operate 10 times for each set of 10 bits. Each operation of the circuit of FIG. 11B would sample each target bit 6 times and produce the 6 outputs $d_N[0]$ through $d_N[5]$ for the 6 samples of the target bit. As is shown, latch 0 through latch 5 receive $CLK_1$ through $CLK_6$, respectively to sample the high data rate bit stream 102. However, the output of the FIG. 11B produces a full set of samples only once per bit stream clock cycle.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A deserializer for deserializing a high data rate bit stream to extract a set of bits, the deserializer comprising:
    a data sampler that oversamples the high data rate bit stream to produce a serial group of samples corresponding to the set of bits of the high data rate bit stream;
    a serial to parallel converter coupled to the data sampler that converts the serial group of samples into a parallel group of samples, wherein the parallel group of samples corresponds to the set of bits, at least one bit preceding the set of bits, and at least one bit subsequent to the set of bits;
    a windowing block coupled to the serial to parallel converter that includes a plurality of overlapping sampling windows, wherein each overlapping sampling window receives a plurality of samples that correspond to a respective target bit and adjacent bits and produces a single bit output, wherein each single bit output represents a corresponding one of the set of bits; and
    a phase error detection block coupled to the windowing block that detects errors in the alignment of the overlapping sampling windows of the windowing block and that directs the windowing block to adjust operation of the plurality of overlapping sampling windows to produce the single bit outputs.

2. The deserializer of claim 1, wherein the serial group of samples also corresponds to bits of the high data rate bit stream adjacent the set of bits of the high data rate bit stream.

3. The deserializer of claim 2, wherein:
    the set of bits includes a most significant bit and a least significant bit;
    an overlapping sampling window that corresponds to a most significant bit of the set of bits also receives samples corresponding to a bit adjacent the most significant bit of the set of bits; and
    an overlapping sampling window that corresponds to a least significant bit of the set of bits also receives samples corresponding to a bit adjacent the least significant bit of the set of bits.

4. The deserializer of claim 1, wherein each overlapping sampling window further comprises a bit selection block that receives a group of samples from its corresponding overlapping sampling window and selects a most likely sample from the group as its single bit output.

5. The deserializer of claim 4, wherein the group of samples received by the bit selection block includes samples corresponding to the single bit and to adjacent bits.

6. The deserializer of claim 4, wherein the bit selection block selects a central sample from the group of samples as the single bit.

7. The deserializer of claim 1, wherein the data sampler samples the high data rate bit stream at a rate that is a multiple of a bit rate of the high data rate bit stream such that the serial group of samples includes a plurality of individual samples for each bit of the high data rate bit stream.

8. The deserializer of claim 7, wherein the multiple of the bit rate is six so that the data sampler produces six individual samples for each bit of the high data rate bit stream.

9. The deserializer of claim 1, further comprising a clock generation block that receives a bit clock corresponding to the high data rate bit stream, produces an oversampling clock for the data sampler, and produces a parallel sample clock for the serial to parallel converter.

10. The deserializer of claim 1, wherein for each overlapping sampling window:
    the windowing block produces a plurality of samples that are received by the phase error detection block; and
    the phase error detection block compares the plurality of samples to a plurality of sample patterns to determine whether the overlapping sampling window is misaligned with the respective target bit.

11. The deserializer of claim 1, wherein for each overlapping sampling window:
    the windowing block produces a plurality of samples that are received by the phase error detection block; and
    the phase error detection block compares the plurality of samples to a plurality of sample patterns to determine to what extent the overlapping sampling window is misaligned with the respective target bit.

12. The deserializer of claim 1, wherein the high data rate bit stream includes visual data.

13. The deserializer of claim 1, wherein the phase error detection block is adjustable to consider different numbers of samples in detecting errors in the alignment of the overlapping sampling windows of the windowing block.

14. A deserializer for deserializing a high data rate bit stream to extract a set of bits, the deserializer comprising:
    a data sampler that oversamples the high data rate bit stream to produce a serial group of samples corresponding to the set of bits of the high data rate bit stream;
    a serial to parallel converter coupled to the data sampler that converts the serial group of samples into a parallel group of samples, wherein the parallel group of samples corresponds to the set of bits, at least one bit preceding the set of bits, and at least one bit subsequent to the set of bits;

a windowing block coupled to the serial to parallel converter that includes a plurality of overlapping sampling windows, wherein each overlapping sampling window receives a plurality of samples that correspond to a respective target bit and adjacent bits and produces a windowed group of samples that corresponds to one of the set of bits;

a bit selection block coupled to the windowing block that, for each bit of the set of bits, receives a windowed group of the plurality of samples that corresponds to one of the set of bits and selects a most likely sample from the windowed group of samples to represent the bit of the set of bits; and a phase error detection block coupled to the windowing block that detects errors in the alignment of the overlapping sampling windows of the windowing block and that directs the windowing block to adjust operation of the plurality of overlapping sampling windows to produce the single bit outputs.

15. The deserializer of claim 14, wherein for each bit of the set of bits, the windowed group of samples received by the bit selection block includes samples corresponding to the bit and adjacent bits.

16. The deserializer of claim 14, wherein for each bit of the set of bits, the bit selection block selects a central sample from the windowed group of samples to represent the bit of the set of bits.

17. A deserializer for deserializing a high data rate bit stream to extract a set of bits, the deserializer comprising:

a data sampler that oversamples the high data rate bit stream to produce a serial group of samples corresponding to the set of bits of the high data rate bit stream, wherein the serial group of samples also corresponds to bits of the high data rate bit stream adjacent the set of bits of the high data rate bit stream;

a serial to parallel converter coupled to the data sampler that converts the serial group of samples into a parallel group of samples, wherein the parallel group of samples corresponds to the set of bits, at least one bit preceding the set of bits, and at least one bit subsequent to the set of bits;

a windowing block coupled to the serial to parallel converter that includes a plurality of overlapping sampling windows, wherein each overlapping sampling window receives a plurality of samples that correspond to a respective target bit and adjacent bits and produces a single bit output, wherein each single bit output represents a corresponding one of the set of bits;

a phase error detection block coupled to the windowing block that detects errors in the alignment of the overlapping sampling windows of the windowing block and that directs the windowing block to adjust operation of the plurality of overlapping sampling windows to produce the single bit outputs;

wherein the set of bits includes a most significant bit and a least significant bit;

wherein an overlapping sampling window that corresponds to a most significant bit of the set of bits also receives samples corresponding to a bit adjacent the most significant bit of the set of bits; and wherein an overlapping sampling window that corresponds to a least significant bit of the set of bits also receives samples corresponding to a bit adjacent the least significant bit of the set of bits.

18. The deserializer of claim 17, wherein the windowing block further comprises a bit selection block that, for each bit of the set of bits, receives a group of samples from the windowing block corresponding to the bit of the set of bits and selects a most likely sample from the group of samples to represent the bit of the set of bits.

19. The deserializer of claim 17, wherein the data sampler samples the high data rate bit stream at a rate that is a multiple of a bit rate of the high data rate bit stream such that the serial group of samples includes a plurality of individual samples for each bit of the high data rate bit stream.

20. A deserializer for deserializing a high data rate bit stream to extract a set of bits, the deserializer comprising:

a data sampler that oversamples the high data rate bit stream to produce a serial group of samples corresponding to the set of bits of the high data rate bit stream;

a serial to parallel converter coupled to the data sampler that converts the serial group of samples into a parallel group of samples, wherein the parallel group of samples corresponds to the set of bits, at least one bit preceding the set of bits, and at least one bit subsequent to the set of bits;

a windowing block coupled to the serial to parallel converter that includes a plurality of overlapping sampling windows, wherein each overlapping sampling window receives a plurality of samples that correspond to a respective target bit and adjacent bits and produces a single bit output, wherein each single bit output represents a corresponding one of the set of bits;

a phase error detection block coupled to the windowing block that detects errors in the alignment of the overlapping sampling windows of the windowing block and that directs the windowing block to adjust operation of the plurality of overlapping sampling windows to produce the single bit outputs;

wherein for each overlapping sampling window:
the windowing block produces a plurality of samples that are received by the phase error detection block;
the phase error detection block compares the plurality of samples to a plurality of sample patterns to determine whether the overlapping sampling window is misaligned with the respective target bit; and wherein the phase error detection block directs the windowing block to adjust operation of the plurality of overlapping sampling windows based upon a composite misalignment of the overlapping sampling windows.

21. The deserializer of claim 20, wherein the serial group of samples also corresponds to bits of the high data rate bit stream adjacent the set of bits of the high data rate bit stream.

22. The deserializer of claim 21, wherein: the set of bits includes a most significant bit and a least significant bit;

an overlapping sampling window that corresponds to a most significant bit of the set of bits also receives samples corresponding to a bit adjacent the most significant bit of the set of bits; and an overlapping sampling window that corresponds to a least significant bit of the set of bits also receives samples corresponding to a bit adjacent the least significant bit of the set of bits.

23. The deserializer of claim 20, wherein the windowing block further comprises a bit selection block that, for each bit of the set of bits, receives a group of samples from the windowing block corresponding to the bit of the set of bits and selects a most likely sample from the group of samples to represent the bit of the set of bits.

24. The deserializer of claim 23, wherein for each bit of the set of bits, the group of samples received by the bit selection block includes samples corresponding to the bit and adjacent bits.

25. The deserializer of claim 23, wherein for each bit of the set of bits, the bit selection block selects a central sample from the group of samples to represent the bit of the set of bits.

26. The deserializer of claim 20, wherein the data sampler samples the high data rate bit stream at a rate that is a multiple of a bit rate of the high data rate bit stream such that the serial group of samples includes a plurality of individual samples for each bit of the high data rate bit stream.

27. The deserializer of claim 20, further comprising a clock generation block that receives a bit clock corresponding to the high data rate bit stream, produces an oversampling clock for the data sampler, and produces a parallel sample clock for the serial to parallel converter.

28. A method for deserializing a high data rate bit stream to extract a set of bits, the method comprising:
 oversampling the high data rate bit stream to produce a serial group of samples corresponding to the set of bits of the high data rate bit stream;
 converting the serial group of samples into a parallel group of samples, wherein the parallel group of samples corresponds to the set of bits, at least one bit preceding the set of bits, and at least one bit subsequent to the set of bits;
 for each of a plurality of overlapping sampling windows, receiving a plurality of samples that correspond to a respective target bit and adjacent bits and producing a single bit output, wherein each single bit output represents a corresponding one of the set of bits;
 detecting errors in the alignment of the overlapping sampling windows; and
 adjusting operation of the plurality of overlapping sampling windows to produce the single bit outputs according to the errors in the alignment of the overlapping sampling windows.

29. The method of claim 28, wherein the serial group of samples also corresponds to bits of the high data rate bit stream adjacent the set of bits of the high data rate bit stream.

30. The method of claim 29, wherein:
 the set of bits includes a most significant bit and a least significant bit;
 an overlapping sampling window that corresponds to a most significant bit of the set of bits also receives samples corresponding to a bit adjacent the most significant bit of the set of bits; and
 an overlapping sampling window that corresponds to a least significant bit of the set of bits also receives samples corresponding to a bit adjacent the least significant bit of the set of bits.

31. The method of claim 28, wherein the high data rate bit stream is sampled at a rate that is a multiple of a bit rate of the high data rate bit stream such that the serial group of samples includes a plurality of individual samples for each bit of the high data rate bit stream.

32. The method of claim 31, wherein the multiple of the bit rate is six so that the data sampler produces six individual samples for each bit of the high data rate bit stream.

33. The method of claim 28, wherein in detecting errors in the alignment of the overlapping sampling windows, for each overlapping sampling window, a plurality of samples produced by the overlapping sampling window are compared to a plurality of sample patterns to determine to what extent the overlapping sampling window is misaligned with a corresponding bit.

34. The method of claim 33, further comprising determining an error offset value used to adjust the alignment of the overlapping sampling windows based upon a composite of the misalignment of the overlapping sampling windows.

35. A method for deserializing a high data rate bit stream to extract a set of bits, the method comprising:
 oversampling the high data rate bit stream to produce a serial group of samples corresponding to the set of bits of the high data rate bit stream;
 converting the serial group of samples into a parallel group of samples, wherein the parallel group of samples corresponds to the set of bits, at least one bit preceding the set of bits, and at least one bit subsequent to the set of bits;
 for each of a plurality of overlapping sampling windows, receiving a plurality of samples that correspond to a respective target bit and adjacent bits and producing a windowed group of samples that correspond to one of the set of bits;
 selecting a most likely sample from the windowed group of samples to represent the bit of the set of bits; and
 detecting errors in the alignment of the overlapping sampling windows of the windowing block and adjusting operation of the plurality of overlapping sampling windows to produce the single bit outputs.

36. The method of claim 35, wherein for each bit of the set of bits, a central sample from the windowed group of samples is selected to represent the bit.

37. A method for deserializing a high data rate bit stream to extract a set of bits, the method comprising:
 oversampling the high data rate bit stream to produce a serial group of samples corresponding to the set of bits of the high data rate bit stream, wherein the serial group of samples also corresponds to bits of the high data rate bit stream adjacent the set of bits of the high data rate bit stream;
 converting the serial group of samples into a parallel group of samples, wherein the parallel group of samples corresponds to the set of bits, at least one bit preceding the set of bits, and at least one bit subsequent to the set of bits;
 for each of a plurality of overlapping sampling windows, receiving a plurality of samples that correspond to a respective target bit and adjacent bits and producing a single bit output, wherein each single bit output represents a corresponding one of the set of bits;
 detecting errors in the alignment of the overlapping sampling windows and adjusting operation of the plurality of overlapping sampling windows;
 wherein the set of bits includes a most significant bit and a least significant bit;
 wherein an overlapping sampling window that corresponds to a most significant bit of the set of bits also receives samples corresponding to a bit adjacent the most significant bit of the set of bits; and
 wherein an overlapping sampling window that corresponds to a least significant bit of the set of bits also receives samples corresponding to a bit adjacent the least significant bit of the set of bits.

38. The method of claim 37, wherein in selecting each bit of the set of bits, the method includes receiving a group of samples corresponding to the bit of the set of bits and selecting a most likely sample from the group of samples to represent the bit of the set of bits.

39. A method for deserializing a high data rate bit stream to extract a set of bits, the method comprising:
- oversampling the high data rate bit stream to produce a serial group of samples corresponding to the set of bits of the high data rate bit stream;
- converting the serial group of samples into a parallel group of samples, wherein the parallel group of samples corresponds to the set of bits, at least one bit preceding the set of bits, and at least one bit subsequent to the set of bits;
- for each of a plurality of overlapping sampling windows, receiving a plurality of samples that correspond to a respective target bit and adjacent bits and producing a single bit output, wherein each single bit output represents a corresponding one of the set of bits;
- detecting errors in the alignment of the overlapping sampling windows; adjusting operation of the plurality of overlapping sampling windows to produce the single bit outputs according to the errors in the alignment of the overlapping sampling windows;
- wherein for each overlapping sampling window:
    - producing a plurality of windowed samples that are received by the phase error detection block; and
    - comparing the plurality of samples to a plurality of sample patterns to determine whether the overlapping sampling window is misaligned with the respective target bit; and
- adjusting operation of the plurality of overlapping sampling windows based upon a composite misalignment of the overlapping sampling windows.

40. The method of claim 39, wherein the serial group of samples also corresponds to bits of the high data rate bit stream adjacent the set of bits of the high data rate bit stream.

41. The method of claim 39, wherein:
- the set of bits includes a most significant bit and a least significant bit;
- an overlapping sampling window that corresponds to a most significant bit of the set of bits also receives samples corresponding to a bit adjacent the most significant bit of the set of bits; and
- an overlapping sampling window that corresponds to a least significant bit of the set of bits also receives samples corresponding to a bit adjacent the least significant bit of the set of bits.

* * * * *